(12) United States Patent
Treadwell et al.

(10) Patent No.: US 6,177,143 B1
(45) Date of Patent: Jan. 23, 2001

(54) ELECTRON BEAM TREATMENT OF SILOXANE RESINS

(76) Inventors: Carl Treadwell, 827 University Ave., Palo Alto, CA (US) 94301; Jingjun Yang, 20800 Homestead Rd., Cupertino, CA (US) 95014; Matthew Ross, 10590 Canyon Lake Dr., San Diego, CA (US) 92131

( * ) Notice: Under 35 U.S.C. 154(b), the term of this patent shall be extended for 0 days.

(21) Appl. No.: 09/226,347

(22) Filed: Jan. 6, 1999

(51) Int. Cl.[7] .................................. C08F 2/48; C08J 7/04; H01L 51/40
(52) U.S. Cl. ..................... 427/515; 427/510; 427/516; 427/508; 522/99; 522/148; 522/172; 528/31; 438/99
(58) Field of Search ........................ 522/99, 148, 172; 528/31; 427/508, 510, 515, 516; 438/99

(56) References Cited

U.S. PATENT DOCUMENTS

| 4,349,609 | * | 9/1982 | Takeda et al. | 428/429 |
|---|---|---|---|---|
| 5,145,723 | | 9/1992 | Ballance et al. | 427/309.7 |
| 5,348,839 | * | 9/1994 | Haluska et al. | 430/270.1 |
| 5,370,904 | | 12/1994 | Mine et al. | 427/126.2 |
| 5,380,567 | | 1/1995 | Haluska | 427/578 |
| 5,696,180 | * | 12/1997 | Irifune et al. | 522/99 |
| 5,738,976 | * | 4/1998 | Okinoshima et al. | 430/285.1 |
| 5,789,460 | * | 8/1998 | Harkness et al. | 522/148 |
| 5,820,944 | * | 10/1998 | Harkness et al. | 427/510 |
| 5,888,649 | * | 3/1999 | Curatolo et al. | 428/352 |
| 5,891,529 | * | 4/1999 | Harkness et al. | 427/510 |
| 5,952,243 | * | 9/1999 | Forester et al. | 438/693 |
| 5,989,983 | * | 11/1999 | Goo et al. | 438/473 |
| 6,051,625 | * | 4/2000 | Harkness et al. | 522/99 |

\* cited by examiner

Primary Examiner—James J. Seidleck
Assistant Examiner—Sanza McClendon

(57) ABSTRACT

Electron beam cured siloxane dielectric films and to a process for their manufacture which are useful in the production of integrated circuits. A siloxane polymer having in one aspect less than 40 Mole percent carbon containing substituents, and in another aspect at least approximately 40 Mole percent carbon containing substituents is cured by a wide beam electron beam exposure.

24 Claims, No Drawings

ELECTRON BEAM TREATMENT OF SILOXANE RESINS

BACKGROUND OF THE INVENTION

1. Field of the Invention

The present invention relates to cured siloxane dielectric films and to a process for their production by electron beam exposure. Such films are useful in the manufacture of integrated circuits (IC's).

2. Description of the Related Art

A continuing trend in the field of semiconductor technology is the formation of integrated circuit chips having more and faster circuits thereon. Such ultralarge scale integration has resulted in a continued shrinkage of feature sizes with the result that a large number of devices are available on a single chip. With a limited chip surface area, the interconnect density typically expands above the chip substrate in a multi-level arrangement and so the devices have to be interconnected across these multiple levels.

The interconnects must be electrically insulated from each other except where designed to make contact. Usually electrical insulation requires depositing dielectric films onto a surface. It is known in the art that siloxane resins are usefull in the electronic and semiconductor fields to provide a dielectric coating to silicon wafers and other components. Such coatings protect the surface of substrates and form dielectric layers between electric conductors on IC's. Such coatings can be used as protective layers, interlevel dielectric layers, doped dielectric layers to produce transistor like devices, capacitor and capacitor like devices, multilayer devices, 3-D devices, silicon on insulator devices, coatings for superconductors, and the like.

As mentioned above, semiconductor devices often have multiple arrays of patterned interconnect levels that serve to electrically couple individual circuit elements thus forming an integrated circuit. In the past, these interconnect levels have been separated by such insulating dielectric films as a silicon oxide film formed using chemical vapor deposition (CVD) or plasma enhanced CVD (PECVD) techniques. However, as the size of circuit elements and the spaces between such elements decreases, the relatively high dielectric constant of such silicon oxide films has become a problem.

In order to provide a lower dielectric constant than that of silicon oxide, dielectric films formed from siloxane based resins are becoming widely used. The production of siloxane resins is well known in the art. In this regard, see U.S. Pat. Nos. 3,615,272; 4,756,977; 5,010,159 and 4,999,397. However, while such siloxane films do provide lower dielectric constants than CVD or PECVD silicon oxide films it has been found that typically the dielectric constants of such films are limited to approximately 3.0 or greater. The dielectric constant of such insulating films is an important factor where IC's with low power consumption, crosstalk, and signal delay are required. As IC dimensions continue to shrink, this factor increases in importance. As a result, siloxane based resin materials that can provide insulating films with dielectric constants below 3.0 are very desirable. In addition, it would be desirable to have a siloxane based resin which have a high resistance to cracking and low stress when formed in thicknesses of approximately 1.0 $\mu$m or greater. It has now been found that such crack resistant, low stress films can be produced when the particular organic siloxane resins of the present invention are cured using electron beam exposure.

Another problem with siloxane based resins is that they must be cured to be effective as a dielectric. Specifically, after a semiconductor wafer having metal lines is coated with the siloxane and cured, it must be resistant to oxygen plasmas in subsequent IC production operations. In the prior art, siloxane polymers have been thermally cured. Unfortunately, thermal curing leaves SiOH bonds in the siloxane polymer. When thermally cured siloxanes are then subjected to oxygen plasma, water is produced by the hydration of the SiOH bonds thus poisoning vias cut through the dielectric in a non-etchback process. It has now been unexpectedly found that electron beam curing changes the properties of the siloxane such that essentially no hydrogen remains after exposure. Thus water formation is avoided or significantly reduced. This results in a denser SiO-SiO structure, minimizing formation of a hydrated film and poisoned vias. In addition, electron beam exposure is much faster than thermal curing, thus increasing IC throughput.

SUMMARY OF THE INVENTION

The invention provides a process for forming a dielectric coating on a substrate which comprises a) forming a dielectric composition film on a substrate, which dielectric composition comprises a polymer having a structure selected from the group consisting of I and II: I.

$[H-SiO_{1.5}]_n[R-SiO_{1.5}]_m$, $[H_{0.5}-SiO_{1.5-1.8}]_n[R_{0.5-1.0}-SiO_{1.5-1.8}]_m$, $[H_{0-1.0}-SiO_{1.5}]_n[R-SiO_{1.5}]_m$, $[H-SiO_{1.5}]_x[R-SiO_{1.5}]_y[SiO_2]_z$, wherein the sum of n and m, or the sum or x, y and z is from about 8 to about 5000, and m and y are selected such that carbon containing substituents are present in an amount of less than about 40 Mole percent; II.

$[HSiO_{1.5}]_n[RSiO_{1.5}]_m$, $[H_{0.5-1.0}SiO_{1.5-1.8}]_n[R_{0.5-1.0}SiO_{1.5-1.8}]_m$, $[H_{0.5-1.0}SiO_{1.5-2.0}][RSiO_{1.5}]_m$, wherein the sum of n and m is from about 8 to about 5000 and m is selected such that the carbon containing substituent is present in an amount of from about 40 Mole percent or greater; and $[HSiO_{1.5}]_x[RSiO_{1.5}]_y[SiO_2]_z$;

wherein the sum of x, y and z is from about 8 to about 5000 and y is selected such that the carbon containing substituent is present in an amount of about 40 Mole % or greater; and wherein R is selected from substituted and unsubstituted straight chain and branched alkyl groups, cycloalkyl groups, substituted and unsubstituted aryl groups, and mixtures thereof;

b) optionally contacting the film with a surface modification composition;

c) optionally heating the film to evaporate solvents from the film;

d) exposing the film to electron beam radiation; and e) optionally thermally annealing the exposed film.

The invention also provides a semiconductor device produced by the above process wherein the substrate is a semiconductor substrate.

DETAILED DESCRIPTION OF THE INVENTION

The first step in conducting the process of the present invention is to form a dielectric composition on a film which comprises one or more polymers having a structure I or II. Polymers having the structure I are of low organic content where the carbon containing substituents are present in an amount of less than about 40 mole percent. These polymers are described more filly in U.S. patent application Ser. No. 09/044,831, filed Mar. 20, 1998, which is incorporated herein by reference.

In accordance with the present invention, siloxane polymers having the structure I have the formulae:

[H-SiO$_{1.5}$]$_n$[R-SiO$_{1.5}$]$_m$,

[H$_{0.5}$-SiO$_{1.5-1.8}$]$_n$[R$_{0.5-1.0}$-SiO$_{1.5-1.8}$]$_m$,

[H$_{0.1-0}$-SiO$_{1.5}$]$_n$[R-SiO$_{1.5}$]$_m$,

[H-SiO$_{1.5}$]$_x$[R-SiO$_{1.5}$]$_y$[SiO$_2$]$_z$, wherein the sum of n and m, or the sum or x, y and z is from about 8 to about 5000, and m and y are selected such that carbon containing substituents are present in an amount of less than about 40 mole percent. R, is selected from substituted and unsubstituted straight chain and branched alkyl groups, cycloalkyl groups, substituted and unsubstituted aryl groups, and mixtures thereof The specific mole percent of carbon containing substituents is a function of the ratio of the amounts of starting materials. In a preferred embodiments the mole percent of carbon containing substituents is in the range of from about 15 mole percent to about 25 mole percent.

In another embodiment of the invention, one may use polymers having the structure II which are of high organic content where the carbon containing substituents are present in an amount of about 40 mole percent or more. These polymers are described more filly in U.S. patent application Ser. No. 09/044,798, filed Mar. 20, 1998, which is incorporated herein by reference. Such have the formulae

[HSiO$_{1.5}$]$_n$[RSiO$_{1.5}$]$_{ml}$,

[H$_{0.5-1.0}$SiO$_{1.5-1.8}$]$_n$[R$_{0.5-1.0}$SiO$_{1.5-1.8}$]$_m$,

[H$_{0-1.0}$SiO$_{1.5-2.0}$]$_n$[RSiO$_{1.5}$]$_m$, wherein the sum of n and m is from about 8 to about 5000 and m is selected such that the carbon containing substituent is present in an amount of from about 40 Mole percent or greater; and

[HSiO$_{1.5}$]$_x$[RSiO$_{1.5}$]$_y$[SiO$_2$]$_z$;

wherein the sum of x, y and z is from about 8 to about 5000 and y is selected such that the carbon containing substituent is present in an amount of about 40 Mole % or greater; and wherein R is selected from substituted and unsubstituted straight chain and branched alkyl groups, cycloalkyl groups, substituted and unsubstituted aryl groups, and mixtures thereof The specific mole percent of carbon containing substituents is a function of the ratio of the amounts of starting materials.

Polymers in accordance with structures I and II have a polymer backbone encompassing alternate silicon and oxygen atoms. In contrast with previously known organosiloxane resins, polymers of the present invention have essentially no hydroxyl or alkoxy groups bonded to backbone silicon atoms. Rather, each silicon atom, in addition to the aforementioned backbone oxygen atoms, is bonded only to hydrogen atoms and/or R groups as defined in the formulae. By attaching only hydrogen and/or R groups directly to backbone silicon atoms in the polymer, unwanted chain lengthening and crosslinking is avoided. Consequently, the shelf life of organohydridosiloxane polymer solutions in accordance with the present invention is enhanced as compared to previously known organosiloxane polymers. Furthermore, since silicon-carbon bonds are less reactive than silicon hydrogen bonds, the shelf life of the organohydridosiloxane polymer solutions in accordance with the invention is enhanced as compared to previously known hydridosiloxane resins. In some embodiments, the polymer backbone conformation is a cage configuration. Accordingly, there are only very low levels of reactive terminal moieties in the polymer. This also ensures that no unwanted chain lengthening polymerization will occur in solution, resulting in an extended shelf life. Each silicon atom of the polymer is bonded to at least three oxygen atoms. Moieties bonded to the polymer backbone include hydrogen and organic moieties.

Synthesis of the organohydridosiloxane polymers of this invention may be by a dual phase solvent system using a catalyst. For example, starting materials may be trichlorosilane and an organotrichlorosilane, for either an alkyl or an aryl substituted trichlorosilane. The relative ratios of the trichlorosilane and the organotrichlorosilane determine the mole percent carbon-containing substituents in the polymer.

Polymers of the structures I and II may be prepared by mixing a solution of at least one organotrihalosilane and hydridotrihalosilane to form a mixture; combining the mixture with a dual phase solvent which includes both a non-polar solvent and a polar solvent; adding a catalyst to the dual phase solvent and trihalosilane mixture, thus providing a dual phase reaction mixture; reacting the dual phase reaction mixture to produce an organohydridosiloxane; and recovering the organohydridosiloxane from the non-polar portion of the dual phase solvent system. Additional steps may include washing the recovered organohydridosiloxane to remove any low molecular weight species, and fractionating the organohydridosiloxane product to thereby classify the product according to molecular weight. The catalyst may be a phase transfer catalyst including, but not limited to, tetrabutylammonium chloride and benzyltrimethylammonium chloride. In other embodiments the catalyst is a solid phase catalyst, such as AmberJet 4200 or Amberlite I-6766 ion exchange resin (Rohm and Haas Company, Philadelphia, Pa.). Such dielectric films formed in accordance with the present invention advantageously provide low dielectric constants, typically less than 2.7. Additionally, dielectric films in accordance with the organohydridosiloxane compositions of this invention exhibit thermal stability permitting cure temperatures of about 425 degrees Centigrade (°C.) or greater. In the preferred embodiment, the carbon containing moiety R may be a substituted or unsubstituted straight chain and branched alkyl groups have 1 to about 20 carbons; substituted and unsubstituted cycloalkyl groups may have from about 4 to about 10 carbons and the substituted and unsubstituted aryl groups have from about 6 to about 20 carbons. For example, where R is an alkyl group, R includes but is not limited to methyl, chloromethyl and ethyl groups, straight chain and branched propyl, 2-chloropropyl, butyl, t-butyl, pentyl and hexyl groups. Where R is a cycloalkyl group, R includes but is not limited to cyclopentyl, cyclohexyl, chlorocyclohexyl and cycloheptyl groups; where R is an aryl group, R includes but is not limited to phenyl, benzyl, naphthyl, tolyl and benzyl groups. It will be understood, that the specific carbon content of any specific organohydridosiloxane resin, in accordance with this invention, is a function of the mole ratio of organotrihalosilane(s) to hydridotrihalosilane starting materials employed. Thus, for any R group selected, a resin in accordance with the present invention having a carbon containing substituent present in an amount of less than about 40 Mole % for a type I structure and at least 40 Mole % is provided for a type II structure. Advantageously, embodiments in accordance with the present invention are polymers having a caged structure with a polymer backbone encompassing alternate silicon and oxygen atoms. In particular, each backbone silicon atom is bonded to at least three backbone oxygen atoms to form the aforementioned cage structure. Essentially all additional silicon bonds are only to hydrogen and the organic substituents. Thus, polymers of the present invention have essentially no hydroxyl or alkoxy groups bonded to backbone silicon atoms and crosslinking reactions are suppressed. In preparing the polymers, a mixture of the organic and hydridosilanes (e.g. trichlorosilane and methyltrichlorosilane) is added to a mixture of catalyst, hydrocarbon solvent, alcohol and water. The mixture is filtered, the water is separated, the solution is dried and then evaporated to leave a white solid. This solid is slurried in hydrocarbon solvent to remove monomer and then evaporated to leave desired product that can be formulated in a suitable solvent for use as a spin-on polymer. The molecular weight (Mw) of the product produced can be varied from about 400 and 200,000 atomic mass units (amu) depending on the reaction conditions. It has been found that materials with a Mw of from about 5,000 to about 60,000 amu are desirable. It has also been found that materials with a Mw of from about 10,000 to about 50,000 amu are somewhat more desirable and materials with a Mw of from about 20,000 to about 40,000 amu are most desirable.

The polymer is dispersed in a suitable compatible solvent and applied onto a substrate. Suitable solvent compositions include those which have a boiling point of about 120° C. or less, preferably about 100° C. or less. Suitable high volatility solvent composition nonexclusively include methanol, ethanol, n-propanol, isopropanol, n-butanol and mixtures thereof. Other relatively high volatility solvent compositions which are compatible with the other ingredients can be readily determined by those skilled in the art. The solvent is preferably present in an amount of from about 10% to about 90% by weight of the overall blend, more preferably from about 15% to about 80% and most preferably from about 40% to about 60% by weight of the overall blend with the polymer.

The dielectric material may be applied to the substrates via conventional spin-coating, dip coating, spraying, or meniscus coating methods which are well-known in the art. Spin coating is most preferred. The thickness of the dielectric film on the substrate may vary depending on the amount of liquid dielectric that is applied to the substrate, but typically the thickness may range from about 500 Å to about 50,000 Å, and preferably from about 2000 Å to about 12000 Å. The amount of dielectric liquid applied to the substrate may vary from about 1 ml to about 10 ml, and preferably from about 2 ml to about 8 ml. In the preferred embodiment, the liquid material is spun onto the upper surface the substrate according to known spin techniques. Preferably, the dielectric is applied from a solution which is centrally applied to the substrate and then spun on a rotating wheel at speeds ranging between about 500 and about 6000 rpm, preferably from about 1500 to about 4000 rpm, for about 5 to about 60 seconds, preferably from about 10 to about 30 seconds, in order to spread the solution evenly across the substrate surface. The dielectric layer preferably has a density of from about 1 g/cm$^3$ to about 3 g/cm$^3$.

Typical substrates are those suitable to be processed into an integrated circuit or other microelectronic device. Suitable substrates for the present invention non-exclusively include semiconductor materials such as gallium arsenide (GaAs), silicon and compositions containing silicon such as crystalline silicon, polysilicon, amorphous silicon, epitaxial silicon, and silicon dioxide (SiO$_2$) and mixtures thereof. On the surface of the substrate is an optional pattern of raised lines, such as metal, oxide, nitride or oxynitride lines which are formed by well known lithographic techniques. Suitable materials for the lines include silica, silicon nitride, titanium nitride, tantalum nitride, aluminum, aluminum alloys, copper, copper alloys, tantalum, tungsten and silicon oxynitride. These lines form the conductors or insulators of an integrated circuit. Such are typically closely separated from one another at distances of about 20 micrometers or less, preferably 1 micrometer or less, and more preferably from about 0.05 to about 1 micrometer.

In an optional additional step, the dielectric film on the substrate may be reacted with an effective amount of a surface modification composition for a period of time sufficient for the surface modification composition to render the film hydrophobic. Preferably the surface modification agent is a compound having a formula selected from the group consisting of: $R_xSiNHSiR_3$, $R_xSiCl_y$, $R_xSi(OH)_y$, $R_3SiOSiR_3$, $R_xSi(OR)_y$, $M_pSi(OH)_{[4-p]}$, $R_xSi(OCOCH_3)_y$ and combinations thereof, wherein x is an integer ranging from 1 to 3, y is an integer ranging from 1 to 3 such that y=4-x, p is an integer ranging from 2 to 3; each R is an independently selected hydrophobic organic moiety; each M is an independently selected hydrophobic organic moiety; and R and M can be the same or different. The R and M groups are preferably independently selected from the group of organic moieties consisting of alkyl, aryl and combinations thereof. The allyl moiety is substituted or unsubstituted and is selected from the group consisting of straight alkyl branched alkyl, cyclic alkyl and combinations thereof, and wherein said alkyl moiety ranges in size from $C_1$ to about $C_{18}$. The aryl moiety is substituted or unsubstituted and ranges in size from $C_5$ to about $C_{18}$. Preferably the hydrophobizing composition comprises acetoxytrimethylsilane, acetoxysilane, diacetoxydimethylsilane, methyltriacetoxysilane, phenyltriacetoxysilane, diphenyldiacetoxysilane, trimethylethoxysilane, trimethylmethoxysilane, 2-trimethylsiloxypent-2-ene4-one, n-(trimethylsilyl)acetamide, 2-(trimethylsilyl) acetic acid, n-(trimethylsilyl)imidazole, trimethylsilylpropiolate, trimethylsilyl(trimethylsiloxy)-acetate, nonamethyltrisilazane, hexamethyldisilazane, hexamethyldisiloxane, trimethylsilanol, triethylsilanol, triphenylsilanol, t-butyldimethylsilanol, diphenylsilanediol or combinations thereof. Most preferably the hydrophobizing composition comprises methyltriacetoxysilane or hexamethyldisilazane. The surface modification agent may be mixed with a suitable solvent such as acetone, applied to the surface in the form of a vapor, and then dried.

In an optional but preferred step, the treated wafer substrate is then heated for a time and at a temperature sufficient to evaporate the solvents from the film. This may be conducted, for example by a hot plate heat treatment at a temperature of from about 170° C. to about 320° C. for about 10 seconds to about 5 minutes, preferably for from about 30 seconds to about 2 minutes. This is preferably done on a hot plate but may also be done in an oven. In a preferred embodiment, the dielectric is first heated at from about 80° C. to about 180° C. for about 30 seconds to about two minutes, then heated at from about 150° C. to about 250° C. for about 30 seconds to about two minutes, and heated a third time at from about 180° C. to about 375° C. for from about 30 seconds to about two minutes. The heat treatment of the film partially crosslinks and solidifies and partially planarizes the layer. After the coating is heated, the thickness of the resulting film ranges from about 500 Å to about 50,000 Å, preferably from about 500 Å to about 20,000 Å, and most preferably from about 1,000 Å to about 12,000 Å.

After formation of the film which may or may not have been treated with the surface modifying agent, the coated substrate is cured by exposing the surface of the substrate to a flux of electrons. The substrate is placed inside the chamber of a large area electron beam exposure system, such as that described in U.S. Pat. No. 5,003,178 to Livesay, the disclosure of which is incorporated herein by reference. This apparatus exposes the entire substrate to an electron beam flux all at once. The period of electron beam exposure will be dependent upon the strength of the beam dosage applied to the substrate and the beam current density. One of ordinary skill in the art can readily optimize the conditions of exposure. Preferably the electron beam exposure is done at a vacuum in the range of from about $10^{-5}$ to about $10^2$ torr, and with a substrate temperature in the range of from about 25° C. to about 1050° C. The electron energy and doses will fall into the ranges of about 0.5 to about 30 KeV and about 500 to about 100,000 $\mu C/cm^2$, respectively. Generally the exposure will range from about 1 minute to about 120 minutes, and preferably from about 3 minutes to about 60 minutes. The dose and energy selected will be proportional to the thickness of the films to be processed. The dielectric coated substrate may be exposed to electron beams in any chamber having a means for providing electron beam radiation to substrates placed therein. The dielectric is preferably subjected to an electron beam radiation from a uniform large-area electron beam source under conditions sufficient to anneal the dielectric film. Preferably the exposure is conducted with an electron beam which covers an area of from about 4 square inches to about 256 square inches. The gaseous ambient in the electron beam system chamber may be nitrogen, argon, oxygen, or any combinations of these gases. Hydrogen or forming gas may also be used as the ambient gas. The electron beam treatment can be performed in such a way that either the entire film or only an upper portion (for example, about the top 5 to 75%) of the film is affected by the electron beam. The metal interconnect vias will intersect this upper portion of the film which is rendered inert toward oxidizing plasmas.

As an optional step, the films are thermally annealed before and after the electron beam treatment. This annealing process may be achieved by heating the substrate at a temperature in the range of about 200 to about 1050° C. over a period in the range of about 1 to about 360 minutes. The annealing process can be performed in an oven or tube furnace at atmospheric pressure. The annealing process may also be done in a vacuum. This thermal annealing causes a crosslinking and densification of the surface.

The following nonlimiting examples serve to illustrate the invention.

EXAMPLE 1

Preparation of 25 Mole Percent Methylhydridosiloxane

A 250 mL Morton flask was fitted with a condenser and a stirrer connected to an Arrow 1750 motor. The flask was purged with $N_2$ and during the reaction $N_2$ was blown across the top of the condenser into an NaOH scrubber. 15 g of Amberlite I-6766 ion exchange resin catalyst, 20 mL of ethanol, 6.3 mL of water, and 250 mL of hexanes were added to the flask, and stirring was started. 13 mL (0.129 mol.) of trichlorosilane and 5 mL(0.043 mol.) of methyltrichlorosilane (24.9 mol % methyltrichlorosilane) were combined together in an HDPE bottle. This mixture of silanes was added to the Morton flask through a peristaltic pump at a rate of 0.6 mL/min. After addition was completed, stirring was continued for 90 min. Solution was filtered by vacuum through a Whatman #4 filter in a buchner funnel. Solution was added to a separatory funnel and the lower, aqueous layer was discarded. The upper layer was dried over 40 g of 3 Å molecular sieves for 2.5 hr. Solution was filtered by vacuum through a Whatman #1 filter paper in a buchner funnel. Solution was evaporated on a Buchi rotary evaporator at 60° C. 5.2 g of white solid was collected. Mw was measured by GPC as 12,300 AMU with a polydispersity of 4.35.

EXAMPLE 2

Preparation of 20 Mole Percent Methyihydridosiloxane

A 2L Morton flask was fitted with a dry-ice condenser and a stirrer connected to an Arrow 1750 motor. Reactor was placed in a water bath set at 25° C. The flask was purged with $N_2$ and during the reaction $N_2$ was blown across the top of the condenser into an NaOH scrubber. 60.25 g of Amberjet 4200(CI) ion exchange resin catalyst, 80 mL of ethanol, 25 mL of water, and 1000 mL of hexanes were added to the flask, and stirring was started. 58 mL (0.575 mol.) of trichlorosilane and 17 mL(0.145 mol.) of methyltrichlorosilane (20.1 mol % methyltrichlorosilane) were combined together in an FEP bottle. This mixture of silanes was added to the Morton flask by peristaltic pump through a ¼" Teflon tube at a set rate of 8.0 RPM. Calculated addition rate was 2.5 mL/min. After addition was completed, stirring was continued for 185 min. Solution was filtered by vacuum through a Whatman #4 filter in a buchner funnel. Solution was added to a separatory funnel and the lower, aqueous layer was discarded. The upper layer was dried over 171 g of 4Å molecular sieves for 3.5 hr. Solution was filtered by vacuum through a Whatman #2 filter paper in a buchner funnel. Solution was evaporated on a Buchi rotary evaporator at 60° C. Yield was 25.2g of white solid. Mw was measured by GPC as 26,014 AMU with a polydispersity of 13.68.

EXAMPLE 3

Preparation of 10 Mole Percent Methylhydridosiloxane

A 500 mL Morton flask was fitted with a condenser and a stirrer connected to an Arrow 850 motor. The flask was purged with $N_2$ and during the reaction $N_2$ was blown across the top of the condenser into an NaOH scrubber. 18.03 g of Amberjet 4200 (Cl) ion exchange resin catalyst, 20 mL of ethanol, 6.3 mL of water, and 250mL of hexanes were added to the flask, and stirring was started. 16 mL(0.159 mol.) of trichlorosilane and 2 mL (0.017 mol.) of methyltrichlorosilane (9.7 mol % methyltrichlorosilane) were combined together in an HDPE bottle. This mixture of silanes was added to the Morton flask through a peristaltic pump at a rate of 0.6 mL/min. After addition was completed, stirring was continued for 98 min. Solution was filtered by vacuum through a Whatman #4 filter in a buchner funnel. Solution was added to a separatory funnel and the lower, aqueous layer was discarded. The upper layer was dried over 30.04 g of 4 Å molecular sieves for 3.25 hr. Solution was filtered by vacuum through a Whatman #1 filter paper in a buchner funnel. Solution was evaporated on a Buchi rotary evaporator at 60° C. 5.9 g of white solid was collected. Mw was measured by GPC as 15,844 AMU with a polydispersity of 4.57.

EXAMPLE 4

Preparation of 2 Mole Percent Methylhydridosiloxane

A 2L jacketed reactor was fitted with a condenser and a stirrer connected to an Arrow 850 motor. The flask was purged with $N_2$ and during the reaction $N_2$ was blown across the top of the condenser into an NaOH scrubber. 105.07 g of Amberjet 4200 (C1) ion exchange resin catalyst, 140 mL of ethanol, 45 mL of water, and 1750 mL of hexanes were added to the flask, and stirring was started. 123 mL (1.219 mol.) of trichlorosilane and 3 mL (0.026 mol.) of methyltrichlorosilane (2.1 mol % methyltrichlorosilane) were combined together. This mixture of silanes was added to the Morton flask through a peristaltic pump at a rate of 3.2 mL/min. After addition was completed, stirring was continued for 25 min. Solution was filtered by vacuum through a Whatman #4 filter in a buchner funnel. Solution was added to a separatory funnel and the lower, aqueous layer was discarded. The upper layer was dried over 354.3 g of 4 Å molecular sieves for 3 hr. Solution was filtered by vacuum through a Whatman #2 filter paper in a buchner funnel. Solution was evaporated on a Buchi rotary evaporator at 60° C. 42.00 g of white solid was collected. Mw was measured by GPC as 2,312 AMU with a polydispersity of 4.80.

EXAMPLE 5

Preparation of 20 Mole Percent Ethylhydridosiloxane

A 1L jacketed reactor was fitted with a dry-ice condenser, a stirrer connected to an Arrow 850 motor, and a glass dip tube. Reactor was connected to a recirculating water bath set at 25° C. The flask was purged with $N_2$ and during the reaction $N_2$ was blown across the top of the condenser into an NaOH scrubber. 60.6 g of Amberjet 4200 (Cl) ion exchange resin catalyst, 80 mL of ethanol, 25 mL of water, and 1000 mL of hexanes were added to the reactor, and stirring was started. 58 mL(0.575 mol.) of trichlorosilane and 19 mL (0.145 mol.) of ethyltrichlorosilane (20.1 mol % ethyltrichlorosilane) were combined together in an FEP bottle. This mixture of silanes was added to the reactor by peristaltic pump through a ¼" Teflon tube at a set rate of 11.2 RPM. Calculated addition rate was 2.2 mL/min. After addition was completed, stirring was continued for 120 min. Solution was filtered by vacuum through a Whatman #4 filter in a buchner funnel. Solution was added to a separatory funnel and the lower, aqueous layer was discarded. The upper layer was dried over 171 g of 4 Å molecular sieves for 3 hr. Solution was filtered by vacuum through a Teflon membrane with 1 micron pores set on a glass frit. Solution was evaporated on a Buchi rotary evaporator at 60° C. Yield was 31.0 g of white solid. Mw was measured by GPC as 23,987 AMU with a polydispersity of 10.27.

EXAMPLE 6

Preparation of 20 Mole Percent Propylhydridosiloxane

A 2L jacketed reactor was fitted with a dry-ice condenser, a stirrer connected to an Arrow 6000 motor, and a glass dip tube. Reactor was connected to a recirculating water bath set at 25° C. The flask was purged with $N_2$ and during the reaction $N_2$ was blown across the top of the condenser into an NaOH scrubber. 59.5 g of Amberjet 4200(CI) ion exchange resin catalyst, 80 mL OF ethanol, 25 mL of water, and 1000 mL. Of hexanes were added to the reactor, and stirring was started. 58 mL (0.575 mol.) of trichlorosilane and 21.5 mL(0.145 mol.) of propyltrichlorosilane (20.1 mol % propyltrichlorosilane) were combined together in an FEP bottle. This mixture of silanes was added to the reactor by peristaltic pump through a ¼" Teflon tube at a set rate of 1.0 RPM. Calculated addition rate was 2.3 ml/min. After addition was completed, stirring was continued for 120 min. Solution was filtered by vacuum through a Whatman #4 filter in a buchner funnel. Solution was added to a separatory funnel and the lower, aqueous layer was discarded. The upper layer was dried over 170.5 g of 4 Å molecular sieves for 3.5 hr. Solution was filtered by vacuum through a Teflon membrane with 1 micron pores set on a glass flit. Solution was evaporated on a Buchi rotary evaporator at 60° C. Yield was 35.8 g of white solid. Mw was measured by GPC as 17,840 AMU with a polydispersity of 7.49.

EXAMPLE 7

Preparation of 20 Mole Percent Cyclohexylhydridosiloxane

A 2L jacketed reactor was fitted with a dry-ice condenser, a stirrer connected to an Arrow 6000 motor, and a glass dip tube. Reactor was connected to a recirculating water bath set at 25° C. The flask was purged with $N_2$ and during the reaction $N_2$ was blown across the top of the condenser into an NaOH scrubber. 60.2 g of Amberjet 4200(CI) ion exchange resin catalyst, 80 mL of ethanol, 25 mL of water, and 1000 mL of hexanes were added to the reactor, and stirring was started. 59 mL (0.585 mol.) of trichlorosilane and 26 mL(0.147 mol.) of cyclohexyltrichlorosilane (20.1 mol % cyclohexyltrichlorosilane) were combined together in an FEP bottle. This mixture of silanes was added to the reactor by peristaltic pump through a ¼" Teflon tube at a set rate of 11.0 RPM. Calculated addition rate was 2.7 mL/min. After addition was completed, stirring was continued for 120 min. Solution was filtered by vacuum through a Whatman #4 filter in a buchner funnel. Solution was added to a separatory funnel and the lower, aqueous layer was discarded. The upper layer was dried over 172.1 g of 4 Å molecular sieves for 5 hr. Solution was filtered by vacuum through a Teflon membrane with I micron pores set on a glass flit. Solution was evaporated on a Buchi rotary evaporator at 60° C. Yield was 42.33 g of white solid. Mw was measured by GPC as 12,721 AMU with a polydispersity of 7.18.

EXAMPLE 8

Preparation of 20 Mole Percent Phenylhydridosiloxane

A 1L jacketed reactor was fitted with a dry-ice condenser, a stirrer connected to an Arrow 6000 motor, and a glass dip tube. Reactor was connected to a recirculating water bath set at 25° C. The flask was purged with $N_2$ and during the reaction $N_2$ was blown across the top of the condenser into an NaOH scrubber. 60.2 g of Amberjet 4200(C1) ion exchange resin catalyst, 80 mL OF ethanol, 25 mL of water, and 1000 mL of hexanes were added to the reactor, and stirring was started. 58 mL(0.575 mol.) of trichlorosilane and 23 mL (0.144 mol.) of phenyltrichlorosilane (20 mol % phenyltrichlorosilane) were combined together in an FEP bottle. This mixture of silanes was added to the reactor by peristaltic pump through a ¼" Teflon tube at a set rate of 7.0 RPM. Calculated addition rate was 2.03 mL/min. After addition was completed, stirring was continued for 120 min. Solution was filtered by vacuum twice through Whatman #4 filters in buchner funnels. Solution was added to a separatory funnel and the lower, aqueous layer was discarded. The upper layer was dried over 171.3 g of 4 Å molecular sieves overnight. Solution was filtered by vacuum through a Teflon membrane with 20 micron pores set on a glass frit. Solution was then further filtered by vacuum through a Teflon membrane with 5 micron pores set on a glass frit. Solution was evaporated on a Buchi rotary evaporator at 60° C. Yield was 22.2 g of white solid. Mw was measured by GPC as 77,827 AMU with a polydispersity of 37.92.

EXAMPLE 9

Preparation of 40 Mole Percent Methylhydridosiloxane

A 6L jacketed reactor equipped with a nitrogen inlet, dry ice condenser and a mechanical stirrer was charged with 5000 mL hexanes, 720 mL ethanol, 65 mL water and 120 g of a 10% by weight tetrabutylammonium chloride hydrate solution in water. The mixture was equilibrated for 0.5 hr with stirring at 25° C. A mixture of trichlorosilane (377.4 g, 2.78 Mol) and methyltrichlorosilane (277.7 g, 1.86 Mol) were added to the reactor using a peristaltic pump over a period of 70 minutes. Upon completion of the silane addition, hexane was pumped through the lines for 10 minutes. The reaction was stirred for 2.3 hours, the ethanol/H$_2$O layer was removed and then the remaining hexane solution filtered through a 3 micron ($\mu$m) filter, followed by a 1 $\mu$m filter. The filtered solution was dried by flowing through a column of 4 Å molecular sieves (800 g) for 2.5 h and then filtered through a 0.0 $\mu$m filter. The hexanes were removed using a rotary evaporator to give 111 g of a white solid product. The GPC of this product, referenced to polystyrene standards, gave a Mw of 24,683 amu.

EXAMPLE 10

Preparation of 80 Mole Percent Methylhydridosiloxane

A 1L jacketed reactor equipped with a nitrogen inlet, dry ice condenser and a mechanical stirrer was charged with 1000 mL hexanes, 80 mL ethanol, 25 mL water and 61.3 g Amberjet 4200 catalyst. The mixture was equilibrated for 0.5 hr with stirring at 25° C. (circulating bath). A mixture of trichlorosilane (14.3 mL, 0.142 Mol) and methyltrichilorosilane (66.7 mL, 0.568 Mol) was added to the reactor using a peristaltic pump over a period of 35 minutes. Upon completion of the silane addition, hexane was pumped through the lines for 10 minutes. The reaction was stirred for 23 hours, then filtered through a Whatman #4 filter. The filtered solution was placed in a separatory funnel and the water/ethanol layer removed. The remaining hexane solution was dried over 4 Å molecular sieves (170 g) for 5h and then filtered through a 1 $\mu$m filter. The hexanes were removed using a rotary evaporator to give a white solid product (23.1 g), 52% yield. The GPC of this product, referenced to polystyrene standards gave a Mw of 11,885 with a polydispersity of 6.5.

EXAMPLE 11

Preparation of 50 Mole Percent Phenyl/30 Mole Percent Methyl Hydridosiloxane

A 6L jacketed reactor equipped with a nitrogen inlet, dry ice condenser and a mechanical stirrer was charged with 2025 mL hexanes 324 mL ethanol, 28 mL water and 81 g of a 10% by weight tetrabutylammonium chloride hydrate solution in water. This mixture was equilibrated for 0.5 hr with stirring at 25° C. A mixture of trichlorosilane (75 g, 0.55 Mol) and methyltrichlorosilane (135 g, 0.90 Mol) and phenyltrichlorosilane (300 g, 1.42 Mol) was added to the reactor using a peristaltic pump over a period of 53 minutes. Upon completion of the silane addition, hexane was pumped through the lines for 10 minutes. The reaction was stirred for 23 hours, the ethanol/H$_2$O layer was removed using a separatory funnel. The remaining hexane solution was filtered through a 3 $\mu$m filter followed by a 1 $\mu$m filter. The filtrate was dried by flowing through a column of 4 Å molecular sieves (800 g) for 2.5 h and then filtered through a 0.05 $\mu$m filter. Hexanes were removed using a rotary evaporator to give a white solid product (33 g), 12% yield. The GPC of this product, referenced to polystyrene standards gave a Mw of 2500 amu.

EXAMPLE 12

Preparation of 20 Mole Percent Benzyl/60 Mole Percent Methyl Hydridosiloxane

A 6L jacketed reactor equipped with a nitrogen inlet, dry ice condenser and a mechanical stirrer was charged with 4500 mL hexanes 720 mL ethanol, 63 mL water and 180 g of a 10% by weight tetrabutylammonium chloride hydrate solution in water. This mixture was equilibrated for 0.5 hr with stirring at 25° C. A mixture of trichlorosilane (173 g, 1.27 Mol) and methyltrichlorosilane (573 g, 3.83 Mol) and t-butyltrichlorosilane (288 g, 1.27 Mol) were added to the reactor using a peristaltic pump over a period of 70 minutes. Upon completion of the silane addition, hexane was pumped through the lines for 10 minutes. The reaction was stirred for 19.5 hours, the ethanol/H$_2$O layer was removed then the hexane solution was filtered through a 3 $\mu$m filter followed by a 1 $\mu$m filter. The filtered solution was dried by flowing through a column of 4 Å molecular sieves (800 g) for 2.5 h and then filtered through a 0.05 $\mu$m filter. The hexanes were removed using a rotary evaporator to give a white solid product (288 g), 58% yield. The GPC of this product, referenced to polystyrene standards gave a Mw of 30,565 with a polydispersity of 22.9.

EXAMPLE 13

E-Beam Curing OF Low Organics Polymers

This example measures both the effects of energy on depth of cure and dose, energy and temperature on material properties. 20 Mole percent methylhydridosiloxane in methyl isobutyl ketone (MIBK) solvent was spun onto 6" Si wafers with edge bead removal (EBR). The wafers were then subjected to e-beam radiation under the conditions listed in TABLE 1. Energy and dose were varied to see if thickness was discernible from SEM analysis between different e-beam energies. Thickness was measured from a SEM photo after staining.

TABLE 1

| Process Condition | Depth of Cure | Total film Thickness | Original Bake Thickness |
|---|---|---|---|
| 3 keV, 6000 $\mu$C/cm$^2$, 10 mA, 375° C. | ~2100 Å | ~4000 Å | ~5000 Å |
| 8 keV, 6000 $\mu$C/cm$^2$, 10 mA, 375° C. | ~4000 Å | ~4000 Å | ~5000 Å |

TABLE 1-continued

| Process Condition | Depth of Cure | Total film Thickness | Original Bake Thickness |
|---|---|---|---|
| 3 keV, 8000 $\mu$C/cm$^2$, 10 mA, 375° C. | ~2290 Å | ~6350 Å | ~8400 Å |
| 4 keV, 8000 $\mu$C/cm$^2$, 10 mA, 375° C. | ~3140 Å | ~4140 Å | ~5420 Å |

These results show that a 3 keV energy exposure will result in ~2200 Å depth of cure (at 6000 or 8000 $\mu$C/cm$^2$). A 4 keV energy exposure will result in ~3100 Å depth of cure (8000 $\mu$C/cm$^2$). A Dose>6000 $\mu$C/cm$^2$ is needed to rid the polymer of any Si-OH peak. The Si-O Cage is completely gone under the conditions in Table 1. Si-H C-H and Si-C peaks are greatly reduced under the conditions in Table 1. Si-OH formation has a strong dependency on energy as well as dose as seen by FTIRs.

EXAMPLE 14

The polymers produced according to Examples 1–12 are similarly subjected to the e-beam exposure conditions given in TABLE 1. Similar results are noticed.

In view of the foregoing, one can see that the present invention provides a organohydridosiloxane polymers which are effectively cured by e-beam radiation.

What is claimed is:

1. A process for forming a dielectric coating on a substrate which comprises
   a) forming a dielectric composition film on a substrate, which dielectric composition comprises a polymer having a structure selected from the group consisting of I and II: I.

[H-SiO$_{1.5}$]$_n$[R-SiO$_{1.5}$]$_m$,

[H$_{0.3}$-SiO$_{1.5-1.8}$]$_n$[R$_{0.5-1.0}$-SiO$_{1.5-1.8}$]$_m$,

[H$_{0-1.0}$-SiO$_{1.5}$]$_n$[R-SiO$_{1.5}$]$_m$,

[H-SiO$_{1.5}$]$_n$[R-SiO$_{1.5}$]$_m$, wherein the sum of n and m, or the sum or x, y and z is from about 8 to about 5000, and m and y are selected such that carbon containing substituents are present in an amount of less than about 40 Mole percent; II.

[HSiO$_{1.5}$]$_n$[RSiO$_{1.5}$]$_m$,

[H$_{0.5-1.0}$SiO$_{1.5-1.8}$]$_n$[R$_{0.5-1.0}$SiO$_{1.5-1.8}$]$_m$,

[H$_{0-1.0}$SiO$_{1.5-2.0}$]$_n$[RSiO$_{1.5}$]$_m$, wherein the sum of n and m is from about 8 to about 5000 and m is selected such that the carbon containing substituent is present in an amount of from about 40 Mole percent or greater; and

[HSiO$_{1.5}$]$_x$[RSiO$_{1.5}$]$_y$[SiO$_2$]$_z$;

wherein the sum of x, y and z is from about 8 to about 5000 and y is selected such that the carbon containing substituent is present in an amount of about 40 Mole % or greater; and wherein R, is selected from substituted and unsubstituted straight chain and branched alkyl groups, cycloalkyl groups, substituted and unsubstituted aryl groups, and mixtures thereof,
   b) optionally contacting the film with a surface modification composition;
   c) optionally heating the film to evaporate solvents from the film;
   d) exposing the film to electron beam radiation; and
   e) optionally thermally annealing the exposed film.

2. The process of claim 1 comprising a polymer having a molecular weight of from about 400 to about 200,000 atomic mass units.

3. The process of claim 1 comprising a polymer I wherein R is selected from the group consisting of methyl ethyl, propyl, butyl, t-butyl, pentyl, hexyl; cyclohexyl; phenyl; benzyl, chloromethyl and mixtures thereof.

4. The process of claim 1 comprising a polymer wherein R is an organic substituent selected from the group consisting of substituted and unsubstituted, straight chain normal and branched allyl groups having from 1 to about 20 carbon atoms, substituted and unsubstituted cycloallyl groups having from about 4 to about 10 carbon atoms, substituted and unsubstituted aryl groups having from 6 to about 20 carbon atoms.

5. The process of claim 1 wherein the electron beam exposure is done at a vacuum in the range of from about 10$^{-5}$ to about 10$^2$ torr, and with a substrate temperature in the range of from about 25° C. to about 1050° C.

6. The process of claim 1 wherein the electron beam exposing is conducted at an energy ranging from about 0.5 to about 30 KeV.

7. The process of claim 1 wherein the electron beam exposing is conducted at an electron dose ranging from about 500 to about 100,000 $\mu$C/cm$^2$.

8. The process of claim 1 wherein the electron beam exposing is conducted with a wide, large beam of electron beam radiation from a uniform large-area electron beam source.

9. The process of 1 wherein the electron beam exposing is conducted with a wide, large beam of electron beam radiation from a uniform large-area electron beam source which covers an area of from about 4 square inches to about 256 square inches.

10. The process of claim 1 wherein the thermal annealing process is conducted by heating the substrate at a temperature in the range of about 200 to about 1050° C. over a period of from about 1 to about 360 minutes.

11. The coated substrate produced according to the process of claim 1.

12. The process of claim 1 wherein the substrate comprises silicon or gallium arsenide.

13. The process of claim 1 wherein the substrate comprises at least one semiconductor material.

14. The process of claim 13 wherein the substrate comprises at least one semiconductor material selected from the group consisting of gallium arsenide, silicon, and compositions containing silicon such as crystalline silicon, polysilicon, amorphous silicon, epitaxial silicon, and silicon dioxide, and mixtures thereof.

15. The process of claim 1 wherein the substrate has a pattern of lines on its surface.

16. The process of claim 15 wherein the lines comprise a metal, an oxide, a nitride or an oxynitride.

17. The process of claim 1 comprising the step (b) of contacting the composition with a surface modification composition.

18. The process of claim 17 wherein the surface modification composition comprises a compound having a formula selected from the group consisting of: $R_3SNHSiR_3$, $R_xSiCl_y$, $R_xSi(OH)_y$, $R_3SiOSiR_3$, $R_xSi(OR)_y$, $M_pSi(OH)_{[4-p]}$, $R_xSi(OCOCH_3)_y$, and combinations thereof, wherein x is an integer ranging from 1 to 3, y is an integer ranging from 1 to 3 such that y=4-x, p is an integer ranging from 2 to 3; each R is an independently selected hydrophobic organic moiety; each M is an independently selected hydrophobic organic moiety; and R and M can be the same or different.

19. The process of claim 17 wherein the surface modification composition comprises a component selected from the group consisting of acetoxytrimethylsilane, acetoxysilane, diacetoxydimethylsilane, methyltriacetoxysilane, phenyltriacetoxysilane, diphenyldiacetoxysilane, trimethylethoxysilane, trimethylmethoxysilane, 2-trimethylsiloxypent-2-ene4-one, n-(trimethylsilyl)acetamide, 2-(trimethylsilyl) acetic acid, n-(trimethylsilyl)imidazole, trimethylsilylpropiolate, trimethylsilyl(trimethylsiloxy)-acetate, nonamethyltrisilazane, hexamethyldisilaaane, hexamethyldisiloxane, trimethylsilanol, triethylsilanol, triphenylsilanol, t-butyldimethylsilanol, diphenylsilanediol and combinations thereof.

20. The process of claim 17 wherein the surface modification composition comprises hexamethyldisilazane.

21. The process of claim 17 wherein the surface modification composition comprises methyltriacetoxysilane.

22. A semiconductor device produced by a process which comprises:
a) forming a dielectric composition film on a semiconductor substrate, which dielectric composition comprises a polymer having a structure selected from the group consisting of I and II: I

[H-SiO$_{1.5}$]$_n$[R-SiO$_{1.5}$]$_m$,

[H$_{0.5}$-SiO$_{1.5-1.8}$]$_n$[R$_{0.5-1.0}$-SiO$_{1.5-1.8}$]$_m$,

[H$_{0.10}$-SiO$_{1.5}$]$_n$[R-SiO$_{1.5}$]$_m$,

[H-SiO$_{1.5}$]$_x$[R-SiO$_{1.5}$]$_y$[SiO$_2$]$_z$, wherein the sum of n and m, or the sum or x, y and z is from about 8 to about 5000, and m and y are selected such that carbon containing substituents are present in an amount of less than about 40 Mole percent;
II.

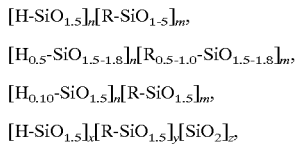

wherein the sum of n and m is from about 8 to about 5000 and m is selected such that the carbon containing substituent is present in an amount of from about 40 Mole percent or greater, and

wherein the sum of x, y and z is from about 8 to about 5000 and y is selected such that the carbon containing substituent is present in an amount of about 40 Mole % or greater; and wherein R, is selected from substituted and unsubstituted straight chain and branched alkyl groups, cycloalkyl groups, substituted and unsubstituted aryl groups, and mixtures thereof;

b) optionally contacting the film with a surface modification composition;

c) optionally heating the film to evaporate solvents from the film;

d) exposing the film to electron beam radiation; and e) optionally thermally annealing the exposed film.

23. A process for forming a dielectric coating on a substrate which comprises
a) forming a dielectric composition film on a substrate, which dielectric composition comprises a polymer having a structure selected from the group consisting of I and II: I.

[H-SiO$_{1.5}$]$_n$[R-SiO$_{1.5}$]$_m$,

[H$_{0.5}$-SiO$_{1.5-1.8}$]$_n$[R$_{0.5-1.0}$-SiO$_{1.5-1.8}$]$_m$,

[H$_{0-1.0}$-SiO$_{1.5}$]$_n$[R-SiO$_{1.5}$]$_m$;

[H-SiO$_{1.5}$]$_x$[R-SiO$_{1.5}$]$_y$[SiO$_2$]$_z$, wherein the sum of n and m, or the sum or x, y and z is from about 8 to about 5000, and m and y are selected such that carbon containing substituents are present in an amount of less than about 40 Mole percent; II.

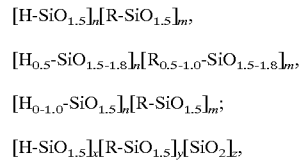

wherein the sum of n and m is from about 8 to about 5000 and m is selected such that the carbon containing substituent is present in an amount of from about 40 Mole percent or greater; and

wherein the sum of x, y and z is from about 8 to about 5000 and y is selected such that the carbon containing substituent is present in an amount of about 40 Mole % or greater; and wherein R, is selected from substituted and unsubstituted straight chain and branched alkyl groups, cycloalkyl groups, substituted and unsubstituted aryl groups, and mixtures thereof; and b) exposing the film to electron beam radiation.

24. A process for forming a dielectric coating on a substrate which comprises
a) forming a dielectric composition film on a substrate, which dielectric composition comprises a polymer having a structure selected from the group consisting of I and II: I.

[H-SiO$_{1.5}$]$_n$[R-SiO$_{1.5}$]$_m$,

[H$_{0.5}$-SiO$_{1.5-1.8}$]$_n$[R$_{0.5-1.0}$-SiO$_{1.5-1.8}$]$_n$,

[H$_{0-1.0}$-SiO$_{1.5}$]$_n$[R-SiO$_{1.5}$]$_m$,

[H-SiO$_{1.5}$]$_x$[R-SiO$_{1.5}$]$_y$[SiO$_2$]$_z$, wherein the sum of n and m, or the sum or x, y and z is from about 8 to about 5000, and m and y are selected such that carbon containing substituents are present in an amount of less than about 40 Mole percent; II.

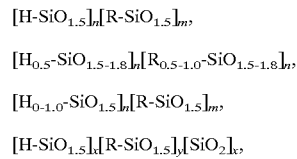

wherein the sum of n and m is from about 8 to about 5000 and m is selected such that the carbon containing substituent is present in an amount of from about 40 Mole percent or greater; and

[HSiO$_{1.5}$]$_x$RSiO$_{1.5}$]$_y$[SiO$_2$]$_z$;

wherein the sum of x, y and z is from about 8 to about 5000 and y is selected such that the carbon containing substituent is present in an amount of about 40 Mole % or greater; and wherein R, is selected from substituted and unsubstituted straight chain and branched alkyl groups, cycloalyl groups, substituted and unsubstituted aryl groups, and mixtures thereof, b) contacting the film with a surface modification composition;
    c) heating the film to evaporate solvents from the film;
    d) exposing the film to electron beam radiation; and
    e) thermally annealing the exposed film.

* * * * *

UNITED STATES PATENT AND TRADEMARK OFFICE
CERTIFICATE OF CORRECTION

PATENT NO.     : 6,177,143 B1                                            Page 1 of 1
DATED          : January 23, 2001
INVENTOR(S)    : Carl Treadwell, Jungjun Yang and Matthew Ross It is certified that error appears in the above-identified patent and that said Letters Patent is hereby corrected as shown below:

<u>Title page,</u>
Item [73], the assignee name should appear as follows:
-- [73] Assignee: AlliedSignal Inc., Morristown NJ (US) --

Signed and Sealed this

Fifth Day of November, 2002

*Attest:*

*Attesting Officer*

JAMES E. ROGAN
*Director of the United States Patent and Trademark Office*